United States Patent
Okamura et al.

(10) Patent No.: US 8,569,101 B2
(45) Date of Patent: Oct. 29, 2013

(54) METHOD FOR FORMING AN ABSORBER LAYER OF A THIN FILM SOLAR CELL

(75) Inventors: Daisuke Okamura, Wako (JP); Tadahiro Kubota, Wako (JP); Katustoshi Nosaki, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 391 days.

(21) Appl. No.: 12/729,907

(22) Filed: Mar. 23, 2010

(65) Prior Publication Data
US 2010/0248420 A1    Sep. 30, 2010

(30) Foreign Application Priority Data
Mar. 24, 2009    (JP) .................................. 2009-071255

(51) Int. Cl.
*H01L 31/042* (2006.01)
*H01L 31/072* (2012.01)

(52) U.S. Cl.
USPC ............. 438/95; 136/262; 136/264; 136/265; 257/E31.027; 977/773

(58) Field of Classification Search
USPC ................... 438/95; 136/256, 262, 264, 265; 257/E31.027; 977/773
See application file for complete search history.

(56) References Cited

U.S. PATENT DOCUMENTS

| | | |
|---|---|---|
| 2006/0220059 A1 | 10/2006 | Satoh et al. |
| 2010/0243043 A1* | 9/2010 | Chuang .......................... 136/256 |
| 2012/0100661 A1* | 4/2012 | Choe et al. ....................... 438/63 |

FOREIGN PATENT DOCUMENTS

WO     2004-090995 A1    10/2004

* cited by examiner

*Primary Examiner* — Mary Wilczewski
*Assistant Examiner* — Toniae Thomas
(74) *Attorney, Agent, or Firm* — Capitol City TechLaw, PLLC

(57) ABSTRACT

In a method for forming a light absorber layer (4) of a thin film solar cell, the absorber layer is formed from a plurality of sub-layers each of which is formed by preparing a plurality of mixtures containing Cu, Se, In and Ga in a liquid medium, a composition ratio of In to Ga being progressively increased from one mixture to another, the mixtures optionally including a mixture containing no In or Ga; applying a layer of one of the mixtures onto a back electrode layer (3) formed on a substrate (2); drying the applied layer of the mixture; and rapidly baking the dried layer of the mixture. By forming the absorber layer with a plurality of thin absorber sub-layers each having a controlled band gap, a solar cell having a large surface area can be fabricated at low cost and the efficiency of the solar cell can be improved by forming a favorable band gap gradient structure. As these sub-layers can be applied simply by any known processes, the method of the present invention is highly suited to be used for mass producing solar cells.

17 Claims, 3 Drawing Sheets

METHOD FOR FORMING AN ABSORBER LAYER OF A THIN FILM SOLAR CELL

RELATED APPLICATIONS

The present application claims foreign priority benefit under 35 U.S.C. §119 from earlier filed Japanese Patent Application No. 2009-071255 filed on Mar. 24, 2009, the disclosure of which is incorporated by reference herein in its entirety for all purposes.

TECHNICAL FIELD

The present invention relates to a method for forming a light absorber layer of a chalcopyrite thin film solar cell.

BACKGROUND OF THE INVENTION

The chalcopyrite thin film solar cell can be manufactured by a variety of manufacturing processes from a wide range of materials, and is therefore susceptible of low cost manufacture and improvement in performance. For this reason, solar cells of this type have been the subject of intensified research and development efforts by a number of research institutions and manufacturing corporations. In recent years, commercialization of chalcopyrite thin film solar cells are being accelerated because of the ease in fabricating large area devices and the low energy consumption in the fabrication process. The chalcopyrite materials preferred for such commercialization include $Cu(In, Ga)Se_2$ and $Cu(In, Ga)(SeS)_2$.

A typical chalcopyrite thin film solar cell has a layered structure, and includes a substrate, a back electrode layer, an absorber layer (a light absorber layer), a buffer layer and a transparent electrode layer that are stacked one above another in that order from the bottom layer or the substrate. The absorber layer has the function to absorb light energy and convert it into electric power, and is therefore considered to be crucial in maximizing the generation and capture of carries in the absorber layer, and improving the performance of the solar cell. It was proposed to progressively increase the band gap of the semiconductor material of the absorber layer from the side of the buffer layer to the side of the back electrode layer. See PCT pamphlet WO2004/090995 (patent document 1). This patent document also discloses a method for forming an absorber layer which includes the steps of forming a Ga layer on a back electrode layer by sputtering or CVS, depositing a $Cu(In, Ga)Se_2$ layer on the Ga layer and thermally diffusing Ga atoms into the $Cu(In, Ga)Se_2$ layer. Changing the ratio of In to Ga causes the band gap to change in a corresponding manner.

Patent document 1 discloses a method for forming an absorber layer in which the band gap is varied by changing the ratio of the composition elements along the direction of the thickness of the film (band gap gradient structure). As this method controls the band gap gradient structure by a thermal diffusion of Ga in an intermediate step, the gradient is dictated by the diffusion constant of Ga, and cannot be controlled at will. When a molecular beam epitaxy (MBE) film forming process, which may be considered as a vapor deposition process, is known to allow the distribution of the ratio of the composition elements to be varied in a progressive manner or the band gap gradient structure along the thickness of the film to be controlled in a relatively precise manner. However, the MBE process is considered to be unsuitable for mass producing solar cells as it is required to be performed in a high vacuum environment, and is not only expensive and time consuming to perform but also unsuitable for processing large surface area devices. There may be other vapor deposition processes and sputtering processes that may be considered as being suitable for mass production, but they do not allow a precise control of composition because of various reasons such as the limitations in the composition of the sputter targets. Therefore, these processes are unsuitable for providing a desired band gap gradient structure.

BRIEF SUMMARY OF THE INVENTION

In view of such problems of the prior art, a primary object of the present invention is to provide a method for forming an absorber layer that allows a solar cell having a large surface area to be fabricated at low cost and the efficiency of the solar cell to be improved by forming a favorable band gap gradient structure.

A second object of the present invention is to provide a method for forming an absorber layer for a chalcopyrite thin film solar cell that is suited to be used for mass producing solar cells.

Such objects of the present invention can be accomplished at least partly by providing a method for forming an absorber layer of a thin film solar cell, comprising: a) preparing a substrate having a back electrode layer formed on one surface thereof; b) preparing a plurality of mixtures containing Cu, Se, In and Ga in a liquid medium, a composition ratio of In to Ga being progressively increased from one mixture to another, the mixtures optionally including a mixture containing no In or Ga; c) applying a layer of one of the mixtures onto the back electrode layer; d) drying the applied layer of the mixture; e) rapidly baking the dried layer of the mixture; f) repeating c) to e) until all of the mixtures have been applied to the back electrode layer; and g) applying a transparent electrode layer on an outer surface of the lastly applied sub-layer of mixture.

Thus, by forming the absorber layer with a plurality of thin absorber sub-layers each having a controlled band gap, a solar cell having a large surface area can be fabricated at low cost and the efficiency of the solar cell can be improved by forming a favorable band gap gradient structure. As these sub-layers can be applied simply by any known processes, including spin-coating, bar coating, dip coating, contact and non-contact printing methods, the method of the present invention is highly suited to be used for mass producing solar cells.

In implementing the present invention, it is important to rapidly bake each sub-layer so as to minimize thermal effect on the underlying sub-layer. Therefore, the dried sub-layer of the mixture is rapidly baked preferably by radiating infrared energy or laser energy thereon.

According to a preferred embodiment of the present invention, the mixtures are prepared by mixing a first mixture and a second mixture at different mixing ratios, the first mixture containing Cu, Se, In and optional Ga at a substantially smaller composition ratio as compared to In, and the second mixture containing Cu, Se, Ga and optional In at a substantially smaller composition ratio as compared to Ga. Thereby, the fabrication process can be simplified.

The liquid medium may comprise an organic solvent such as toluene. In particular, the mixtures may be prepared by mixing small particles preferably of a nanometer order of members selected from a group consisting of Ga, In, Ga compound and In compound in the liquid medium so that the conversion efficiency of the fabricated solar cells may be maximized.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
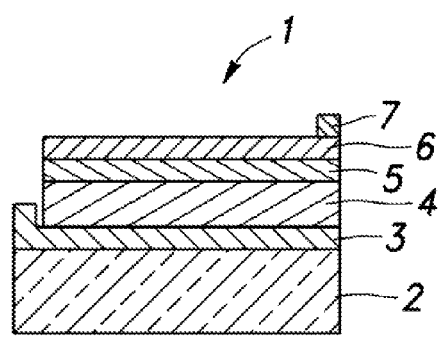
FIG. 1 is a diagrammatic sectional view of a solar cell incorporated with an absorber layer embodying the present invention.

A preferred embodiment of the present invention is described in the following with reference to the appended drawings. FIG. 1 is a diagrammatic sectional view of a chalcopyrite solar cell incorporated with an absorber layer embodying the present invention. The solar cell 1 is provided with a laminated structure including a substrate 2, a back electrode layer 3 forming a positive pole of the solar cell 1, a CIGS absorber layer 4, a buffer layer 5 and a transparent electrode layer 6 stack one above another in that order. The solar cell 1 is additional provided with an electrode 7 electrically connected to the transparent electrode layer 6, and forming a negative pole of the solar cell 1.

The substrate 2 consists of sheet glass in the illustrated embodiment, but may also consist of other materials such as a metallic foil, a plastic sheet and so on which may be more light weight and/or flexible. The back electrode layer 3 consists of a Mo film in the illustrated embodiment, but may consist of other metallic material such as W, Ti and so on which may be resistant to corrosion and have a high melting point. The CIGS absorber layer 4 which may be made of Cu, In, Ga and Se consists of a p-type semiconductor material as will be described hereinafter. The buffer layer 5 may consist of a n-type semiconductor material such as CdS, ZnS and InS. The transparent electrode layer 6 may consist of a $n^+$-ZnO semiconductor film.

All these layers other than the CIGS absorber layer 4 can be formed by using processes commonly used for the fabrication of solar cells. The substrate 2 and back electrode layer 3 may be prepared by purchasing or otherwise preparing a semi-finished product consisting of a substrate 2 having a back electrode layer 3 formed thereon. The back electrode layer 3 may be conveniently formed on the substrate 2 by sputtering. A bath deposition method may be used for forming the buffer layer 5 on the CIGS absorber layer 4. A sputtering method may be used for forming the transparent electrode layer 6 on the buffer layer 5. Any known method may be used for forming the electrode 7 on the transparent electrode layer 6 as long as it establishes an electric connection between the electrode 7 and transparent electrode layer 6.

In the illustrated embodiment, the CIGS absorber layer 4 was formed (as will be described hereinafter) on a soda-lime glass substrate 2 having a Mo back electrode layer 3 already formed thereon. Thereafter, a InS buffer layer 5 and a AZO (aluminum added with ZnO) transparent electrode layer 6 were formed on the CIGS absorber layer 4, and patterned into a plurality of cells. The InS buffer layer 5 was formed to a thickness of 70 nm by a bath deposition process, and the AZO transparent electrode layer 6 was formed to a thickness of 1.0 μm by a RF sputtering process.

CIGS Absorber Layer

Figure 2:
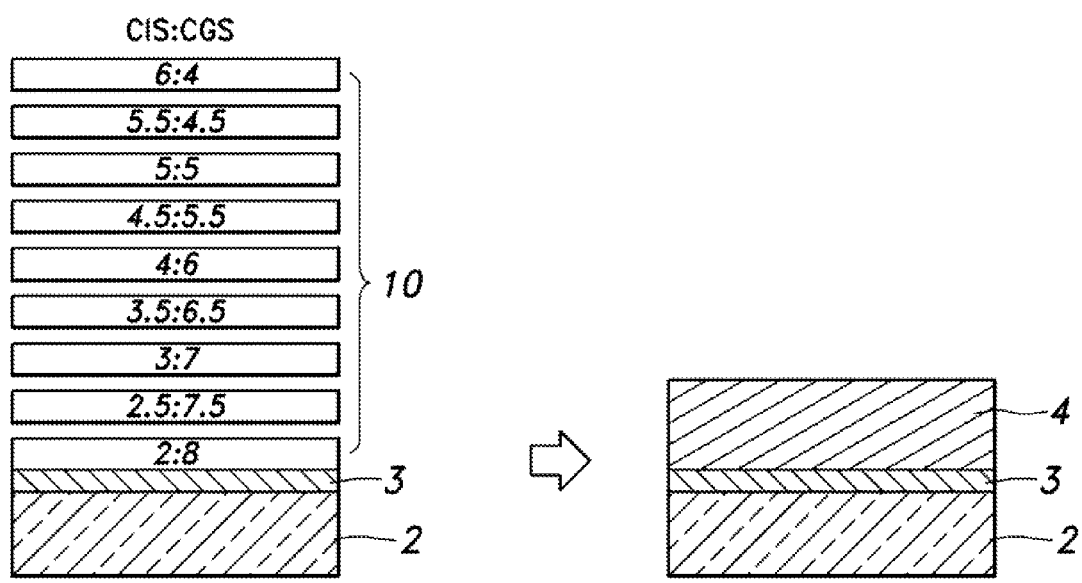
FIG. 2 is a diagrammatic sectional view of the CIGS absorber layer.

FIG. 2 is a sectional view of an assembly including the substrate 2, back electrode 3 and CIGS absorber layer 4. The CIGS absorber layer 4 is formed by applying, drying and rapidly baking a plurality of sub-layers of ink (mixture) 10, each having a progressively different composition, one after another. The ink (mixture) crystallizes as it is baked. The difference in the composition of the ink 10 from one sub-layer to another essentially consists in the ratio of In to Ga. The Ga content diminishes and the In content increases from a lower layer to an upper layer. The applying, drying and rapidly baking steps are repeated for each sub-layer of the ink 10. Therefore, in the final CIGS absorber layer 4, a gradient structure is formed in which the Ga content decreases and the In content increases from the side of the back electrode layer 3 to the side of the buffer layer 5. The ink 10 may be formed by mixing particles containing Cu, In, Ga and Se in an organic solvent. The particles preferably consist of extremely fine particles that may have sizes in the order of nanometers. In extreme cases, the In or Ga content could be zero. In the example given in FIG. 2, nine kinds of ink 10 having the In to Ga ratios of (6:4), (5.5:4.5), (5:5), (4.5:5.5), (4:6), (3.5:6.5), (3:7), (2.5:7.5), and (2:8) were used. By forming such a composition gradient structure, the efficiency of converting light energy into electric power can be improved.

Figure 3:
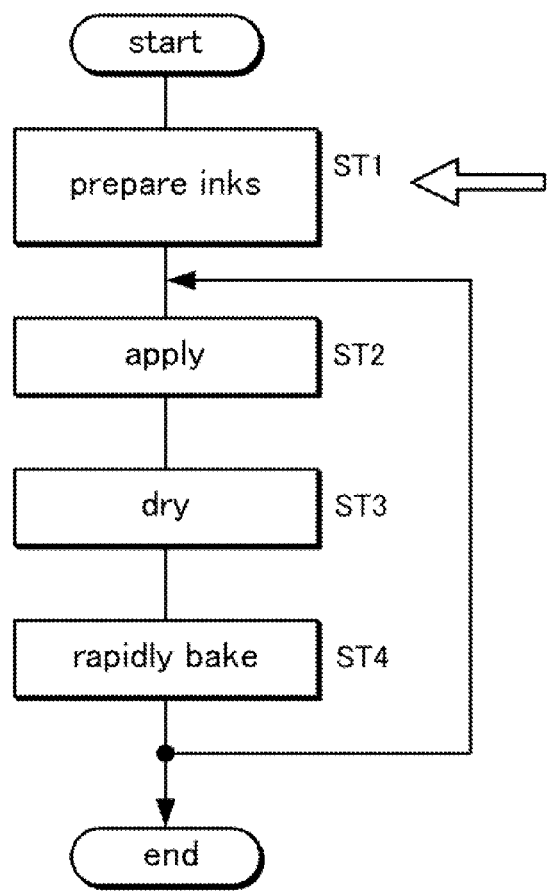
FIG. 3 is a flowchart illustrating the process of forming the CIGS absorber layer.

FIG. 3 illustrates the process of forming the CIGS absorber layer by laminating sub-layers each having a progressively different composition of Ga and In.

First of all, a plurality of inks 10 containing Cu, In, Ga and Se, and differing from one another in the composition ratio of In and Ga are prepared in step ST1. More specifically, two different kinds of $Cu(In, Ga)Se_2$ are chemically composed, and are each mixed or suspended in an organic solvent at a prescribed concentration. The two solutions are then mixed at various ratios. It is possible to form one of the mixtures as a CIS solution containing $CuInSe_2$ (substantially without any Ga or with a very small Ga content) as the solute and the other as a CGS solution containing $CuGaSe_2$ (substantially without any In or with a very small In content) as the solute. Thereby, the preparation of the ink 10 can be simplified, and the composition can be varied at will without any difficulty.

In the illustrated embodiment, two chalcopyrite mixtures consisting of a CIS nano particle ink and a CGS nano particle ink were prepared. The CIS nano particle ink was prepared by mixing CIS nano particles having a molecular composition of Cu:In:Se=21:24:55 and a particle size of 4 nm in toluene at a weight ratio of CIS: toluene=1:3. The CGS nano particle ink was prepared by mixing CGS nano particles having a molecular composition of Cu:Ga:Se=18:22:60 and a particle size of 4 nm in toluene at a weight ratio of CGS: toluene=1:5. The Se content of the CGS nano particles is made greater than that of the CIS nano particles because Se has a high tendency to react with Mo contained in the back electrode layer 3 and form a compound, and this otherwise could cause a shortage of Se in a lower part of the absorber layer 4 which has a higher CGS content. The two inks 10 both had a viscosity of about 5 mPa·s. The two inks were mixed at nine different mixture ratios which were (6:4), (5.5:4.5), (5:5), (4.5:5.5), (4:6), (3.5: 6.5), (3:7), (2.5:7.5), and (2:8).

The inks 10 were applied onto the substrate 1 having the back electrode layer 2 formed thereon in the ascending order of the numerals assigned to the inks in the table of FIG. 3 (step ST2). In the illustrated embodiment, the inks 10 were applied onto a soda-lime glass substrate 2 having a Mo back electrode layer 3 formed thereon by using a spin coater (3,000 rpm for 30 seconds). A bar coater, a dip coater or a ink jet printer may also be used for the application of the inks 10, instead of a spin coater.

The applied inks were dried (step ST3). In the illustrated embodiment, a hot plate was used for drying each sub-layer of the ink 10 at 100° C. for ten minutes.

The dried ink was then rapidly baked in a heating/annealing process (step ST4), and this caused the particles in the ink 10 to grow into a dense and fine layer. The finished film thickness was 0.05 to 0.3 μm. The rapid heating process can be conveniently effected by a rapid thermal annealing (RTA) chamber which is capable of rapidly raising the temperature of the ink in a short period of time. But other heating fixtures may also be used without departing from the spirit of the present invention. In the illustrated embodiment, the ink was baked in an infrared lamp heating chamber at a temperature of 500° C. The time period for raising the temperature to the final temperature of 500° C. was three minutes, and this temperature was maintained for one minutes before the temperature was lowered to the ambient temperature over a time period of three minutes. On account of this baking process, the film thickness which was about 0.3 μm immediate following the spin coating step was finally reduced to about 0.2 μm.

The step of forming the absorber sub-layer in steps ST2 to ST4 was repeated by a prescribed number of times, and the ink 10 used in each step is changed from one having a larger Ga content (or smaller In content) to one having a smaller Ga content (or larger In content) in a progressive manner. In the illustrated embodiment, in the ascending order of the numerals given in the table of FIG. 3, this step was repeated nine times. In other words, the mixture ratios were selected in the order of (CIS:CGS)=(6:4), (5.5:4.5), (5:5), (4.5:5.5), (4:6), (3.5:6.5), (3:7), (2.5:7.5), and (2:8).

Function and Effect of the Embodiment

When a more conventional heating method is used for the thermal process (baking process), because the deposited layer of ink is retained at a high temperature for a prolonged period of time, the atoms are allowed to diffuse freely, and the composition of the CIGS is relatively homogenized so that a desired gradient structure may not be obtained. On the other hand, when a RTA chamber is used, because each individual ink layer is heated in a short period of time without substantially affecting the underlying layers, the diffusion of atoms to the lower layers are minimized, and each ink sub-layer may be given with a controlled composition. Therefore, a well defined composition gradient can be achieved.

This fabrication process enables a CIGS absorber layer 4 having a favorable gradient structure to be mass produced without any difficulty as opposed to the MEB method. The production fixtures required for performing the process described above cost significantly less than those used for vapor deposition processes, and this allows a significant reduction in the fabrication cost. Also, the solar cell 1 incorporated with the CIGS absorber layer 4 described above demonstrates a high conversion efficiency owing to the favorable gradient structure of the CIGS absorber layer 4.

Figure 4:
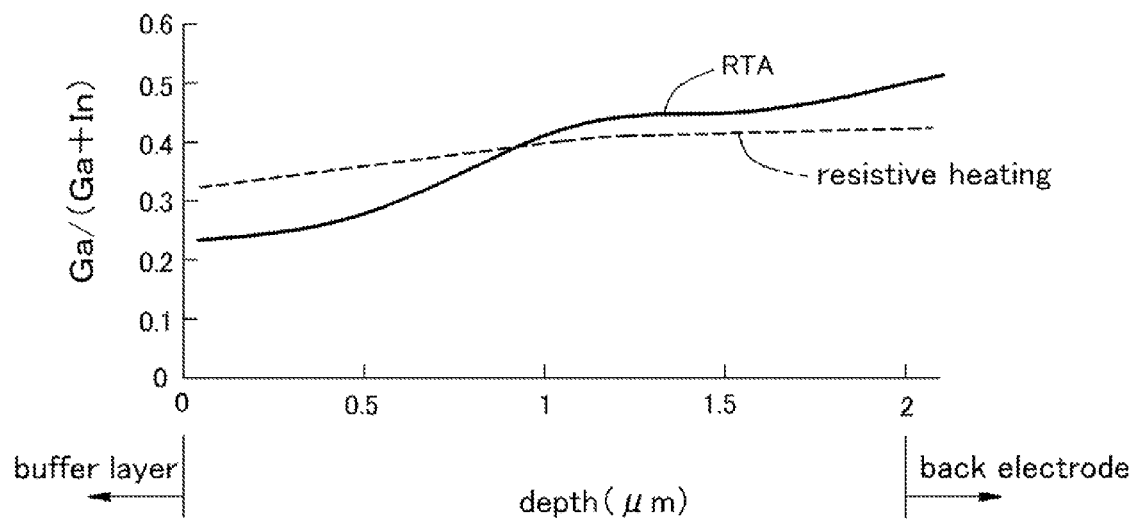
FIG. 4 is a graph showing a result of SIMS analysis performed on the CIGS absorber layer fabricated by the method of the present invention in comparison to that of the prior art.

The depth-wise distribution of the composition of the CIGS absorber layer formed as described above is analyzed by using secondary ion mass spectrometry (SIMS), and the result is shown in the graph of FIG. 4. In FIG. 4, the line denoted with RTA represents the illustrated embodiment, and the line denoted with resistive heating chamber represents an example for comparison in which the absorber layer is baked in a resistive heating chamber. In the baking process of the example for comparison, the absorber layer was heated to the final temperature over a time period of about 30 minutes, and cooled to a temperature below 100° C. over a time period of about 30 minutes. Otherwise, the conditions are the same both for the embodiment and example for comparison.

Referring to FIG. 4, as for the absorber layer baked in a resistive heating chamber, the Ga/(Ga+In) ratio between two adjacent layers is smaller, and the composition gradient is smaller, as compared to those of the embodiment. Therefore, the carriers excited by light energy cannot be captured at a high efficiency. The homogenization of the composition in the example for comparison is due to the diffusion of composition atoms that takes place during the repeated heating processes.

Figure 5:
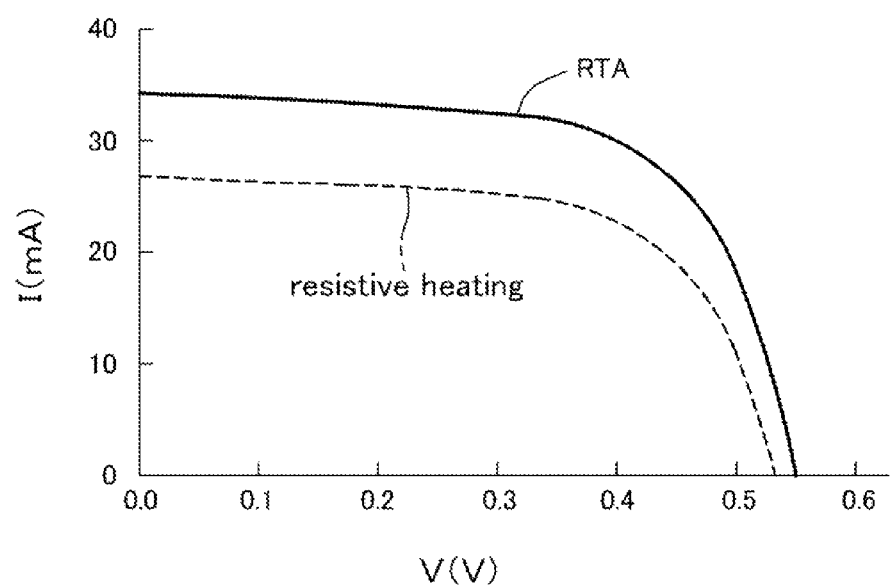
FIG. 5 is a current-voltage property of the solar cell of the illustrated embodiment in comparison to that of the prior art.

The current (I)-voltage (V) properties of the embodiment and example for comparison are shown in the graph of FIG. 5. The short-circuit current of the solar cell of the embodiment was 34.1 mA whereas the short-circuit current of the solar cell of the example for comparison was 26.9 mA. Thus, the solar cell of the embodiment has a higher output and a higher conversion efficiency that the solar cell of the example for comparison.

The baking process of the illustrated embodiment using an RTA chamber required about 7 minutes for each sub-layer whereas the baking process of the example for comparison using a resistive heating chamber required more than 60 minutes. Therefore, the baking process of the illustrated embodiment using an RTA chamber is much more suitable for mass production.

Because the absorber layer 4 consists of a layered structure, the gradient of the composition or the band gap gradient structure can be selected at will.

The rapid baking process may also be performed by laser annealing which involves the radiation of laser energy onto an object for rapidly and locally heating the object. Chalcopyrite compounds are known to have relatively high light absorbing coefficients as compared to other semiconductor materials, and almost all of the radiated laser energy is absorbed by the surface of the chalcopyrite compound without penetrating into the interior of each film. By properly tuning the wavelength of the laser energy to the ink 10, the temperature of the chalcopyrite compound contained in the ink 10 can be raised very rapidly. Therefore, only the outermost surface of the ink containing the chalcopyrite compound is locally and effectively heated.

Specifically, a laser beam produced by a second harmonic Nd-YAG laser ($\lambda$=532 nm) is scanned onto the ink 10 which is applied onto the back electrode layer and dried. This wavelength is suited to heat chalcopyrite materials. When a test conducted at the radiation energy of 1 J/cm$^2$ and a radiation speed of 10 m/sec, a result similar to that obtained by using an RTA chamber was obtained.

According to a modified embodiment of the present invention, a plurality of inks were obtained by chemically synthesizing Cu(In, Ga)Se$_2$ compounds containing In and Ga in variously different ratios and mixing the compounds in an organic solvent such as toluene. The mixing ratio of Ga and In, and the number of different inks may be changed as required without departing from the spirit of the present invention.

The particles used for preparing CIS mixtures, CGS mixtures and inks may consist of combinations of pure Cu, In, Ga and Se particles, combinations of compounds containing Cu, In, Ga and Se, or combinations of pure Cu, In, Ga and Se particles and Cu, In, Ga and Se compound particles. For instance, CIS mixtures may be prepared by mixing Cu—In compound particles and pure Se particles in an organic solvent while CGS mixtures are prepared by mixing Cu—Ga compound particles and pure Se particles in an organic solvent.

Although the present invention has been described in terms of a preferred embodiment thereof, it is obvious to a person skilled in the art that various alterations and modifications are possible without departing from the scope of the present invention which is set forth in the appended claims.

The contents of the original Japanese patent application on which the Paris Convention priority claim is made for the present application are incorporated in this application by reference.

What we claim is:

1. A method for forming an absorber layer of a thin film solar cell, comprising:
   a) preparing a substrate having a back electrode layer formed on one surface thereof;
   b) preparing a plurality of mixtures containing Cu, Se, In and Ga in a liquid medium, a composition ratio of In to Ga being progressively increased from one mixture to another;
   c) applying a layer of one of the mixtures onto the back electrode layer;
   d) drying the applied layer of the mixture;
   e) rapidly baking the dried layer of the mixture;
   f) repeating c) to e) until all of the mixtures have been applied to the back electrode layer; and
   g) applying a transparent electrode layer on an outer surface of the lastly applied layer of mixture.

2. The method for forming an absorber layer of a thin film solar cell according to claim 1, wherein the dried layer of the mixture is rapidly baked by radiating infrared energy thereon.

3. The method for forming an absorber layer of a thin film solar cell according to claim 1, wherein the dried layer of the mixture is rapidly baked by radiating laser energy thereon.

4. The method for forming an absorber layer of a thin film solar cell according to claim 1, wherein the mixtures are prepared by mixing a first mixture and a second mixture at different mixing ratios, the first mixture containing Cu, Se, In and optional Ga at a substantially smaller composition ratio as compared to In, and the second mixture containing Cu, Se, Ga and optional In at a substantially smaller composition ratio as compared to Ga.

5. The method for forming an absorber layer of a thin film solar cell according to claim 1, wherein the liquid medium comprises an organic solvent.

6. The method for forming an absorber layer of a thin film solar cell according to claim 5, wherein the organic solvent comprises toluene.

7. The method for forming an absorber layer of a thin film solar cell according to claim 1, wherein the mixtures are prepared by mixing small particles of members selected from a group consisting of Ga, In, Ga compound and In compound in the liquid medium.

8. The method for forming an absorber layer of a thin film solar cell according to claim 7, wherein the small particles essentially consist of nano particles.

9. The method for forming an absorber layer of a thin film solar cell according to claim 1, wherein the mixtures include a mixture containing no In or Ga.

10. A method for forming an absorber layer of a thin film solar cell, comprising:
    a) preparing a substrate having a back electrode layer formed on one surface thereof;
    b) preparing a plurality of mixtures containing Cu, Se and only one or both of In and Ga in a liquid medium, with a composition ratio of In to Ga being progressively varied from one mixture to another;
    c) applying a layer of one of the mixtures onto the back electrode layer;
    d) drying the applied layer of the mixture;
    e) rapidly baking the dried layer of the mixture;
    f) repeating c) to e) until all of the mixtures have been applied to the back electrode layer; and
    g) applying a transparent electrode layer on an outer surface of the lastly applied layer of mixture.

11. The method for forming an absorber layer of a thin film solar cell according to claim 10, wherein the dried layer of the mixture is rapidly baked by radiating infrared energy thereon.

12. The method for forming an absorber layer of a thin film solar cell according to claim 10, wherein the dried layer of the mixture is rapidly baked by radiating laser energy thereon.

13. The method for forming an absorber layer of a thin film solar cell according to claim 10, wherein the mixtures are prepared by mixing a first mixture and a second mixture at different mixing ratios, the first mixture containing Cu, Se, In and optional Ga at a substantially smaller composition ratio as compared to In, and the second mixture containing Cu, Se, Ga and optional In at a substantially smaller composition ratio as compared to Ga.

14. The method for forming an absorber layer of a thin film solar cell according to claim 10, wherein the liquid medium comprises an organic solvent.

15. The method for forming an absorber layer of a thin film solar cell according to claim 14, wherein the organic solvent comprises toluene.

16. The method for forming an absorber layer of a thin film solar cell according to claim 10, wherein the mixtures are prepared by mixing small particles of members selected from a group consisting of Ga, In, Ga compound and In compound in the liquid medium.

17. The method for forming an absorber layer of a thin film solar cell according to claim 16, wherein the small particles essentially consist of nano particles.

* * * * *